(12) United States Patent
Weber et al.

(10) Patent No.: US 6,504,433 B1
(45) Date of Patent: Jan. 7, 2003

(54) CMOS TRANSCEIVER HAVING AN INTEGRATED POWER AMPLIFIER

(75) Inventors: David J. Weber, Sunnyvale, CA (US); Patrick Yue, Milpitas, CA (US); David Su, Mountain View, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 103 days.

(21) Appl. No.: 09/663,101

(22) Filed: Sep. 15, 2000

(51) Int. Cl.[7] .............................. H03F 1/22; H03F 3/16
(52) U.S. Cl. ...................................... 330/277; 330/311
(58) Field of Search .................... 330/277, 307, 330/311

(56) References Cited

U.S. PATENT DOCUMENTS

| | | | |
|---|---|---|---|
| 4,003,071 A | 1/1977 | Takagi | 357/42 |
| 4,520,324 A | 5/1985 | Jett, Jr. et al. | 330/285 |
| 4,697,153 A | 9/1987 | Lish | 330/277 |
| 6,084,476 A | 7/2000 | Hamanishi et al. | 330/255 |
| 6,366,172 B1 * | 4/2002 | Hayashi et al. | 330/311 |

FOREIGN PATENT DOCUMENTS

| | | |
|---|---|---|
| EP | 0 635 932 A2 | 1/1995 |
| EP | 0 833 442 A1 | 1/1998 |
| JP | 01254014 A | 10/1989 |
| JP | 2000-101356 A | 4/2000 |

OTHER PUBLICATIONS

Lee, "Wideband characterization of mutual coupling between high density bonding wires" (8099a, IEEE Microwave & Guided Wave Letters, Aug. 4, 1994, No. 8, New York., pp. 265–267).

Itoh, et al. "A 1.0V GaAs Receiver Front–end IC for mobile communication equipment" (IEEE 1996 Microwave and Millimeter–Wave Monolithic Circuits, 1996, pp. 77–80).

Kuo, et al., "1.5W Class–F RF Power amplifier in 0.2 ρm CMOS Technology"; 2001 IEEE Int'l Solid–State Circ. Conf. (Feb. 6, 2001, pp. 154–155).

Cho, et al., "A single–chip CMOS direct–conversion transceiver for 900 MHz spread–spectrum digital cordless phones" (1999 IEEE Int'l Solid–State Circ. Conf. 0–7803–5129–0/99, 10 pp.).

* cited by examiner

*Primary Examiner*—Steven J. Mottola
(74) *Attorney, Agent, or Firm*—Pillsbury Winthrop LLP

(57) ABSTRACT

The present invention provides a breakdown resistant transistor structure for amplifying communication signals. This structure includes a first NMOS transistor having a source connected to ground and a first gate for receiving the input radio frequency signal. The first gate is disposed above a first insulator and the first NMOS transistor having a first transconductance and a first breakdown voltage associated therewith. Also included is a second NMOS transistor having a source connected to the drain of the first NMOS transistor, a gate connected to the reference DC voltage, and a drain that provides the output for the amplified radio signal, the load being disposed between the reference DC voltage and the drain of the second NMOS transistor. The second gate is disposed above a second insulator, the second NMOS transistor has a second transconductance and a second breakdown voltage associated therewith, and the second insulator may be thicker than the first insulator. This results in the first transconductance being greater than the second transconductance, and the second breakdown voltage being greater than the first breakdown voltage.

20 Claims, 6 Drawing Sheets

CMOS TRANSCEIVER HAVING AN INTEGRATED POWER AMPLIFIER

FIELD OF THE INVENTION

The present invention relates to an integrated circuit power amplifier, and more specifically a power amplifier that is integrated with other complementary metal oxide semiconductor (CMOS) circuit component that allows for substantially linear operation within a gigahertz frequency band of interest.

BACKGROUND OF THE RELATED ART

A transceiver is a well-known circuit containing a transmitter and a receiver, which are thus capable of transmitting and receiving communication signals, respectively. Conventionally, the transmitter contains a power amplifier (also known as "PA") that provides the last stage of amplification of the signal to be transmitted.

In most conventional designs, the power amplifier is implemented as a component that is physically separate from other parts of the transmitter and/or transceiver. Power amplifier's made from gallium arsenide (GaAs) or Silicon bipolar junction transistors (SiBJT) are typically used because they have an inherently higher breakdown voltage than transistors made in CMOS circuit, whether the transistors are n-channel or p-channel transistors. While such designs allow for a power amplifier that has the desired amplification characteristics, they do so at the expense of cost. Not only is a GaAs, SiBJT or other non-CMOS power amplifier costlier than a transistor in a CMOS integrated circuit, but the non-CMOS power amplifier cannot be formed on the same integrated circuit chip as the components of the transmitter and/or transceiver. Both of these factors add to the overall cost of the resulting transceiver.

It has been recognized that it would be beneficial to have a transceiver in which most of the transmitter and receiver circuits are on a single chip, including the power amplifier. For example, in the article entitled *A Single Chip CMOS Direct-Conversion Transceiver for 900 MHz Spread Spectrum Digital Cordless Phones* by T. Cho etal. that was presented at the 1999 IEEE International Solid State Circuits Conference, there is described a CMOS transceiver chip that includes an integrated power amplifier. This power amplifier is implemented as a three-stage class AB amplifier. While this power amplifier is integrated on the same integrated circuit chip many of the other transceiver components, the power amplifier described has a number of disadvantages.

One of these is that this circuit is not designed to tolerate supply voltages that significantly exceed the transistor breakdown voltages. In particular, transistors used in deep-submicron CMOS circuits having a high-transconductance cannot reliably tolerate junction voltages that are significantly higher than the supply voltage. An integrated RF power amplifier, however, is most efficient when the voltage at the RFout node swings from 0 to at least 2*Vdd, an amplitude made possible by the inductive load at the output of the circuit. The inductive load is typically an inductor connected between the supply and the drain of the output transistors of the power amplifier. Furthermore, since the RFout node is typically connected directly to the antenna, the possibility of transmitted power reflecting backwards to the power amplifier causes the maximum voltage at the RFout node to approach 4*Vdd. This voltage is well beyond the breakdown voltage of modern CMOS devices, and can cause unpredictable performance or device damage.

Another disadvantage is that the integrated power amplifier presented above provides non-linear operation. Further, it is intended for operation in the range of 900 MHz, and not substantially higher frequencies in the gigahertz range.

Still furthermore, when an integrated power amplifier is made on a CMOS chip with a substantial number of the transmitter and receiver components, there is a corresponding increase in the number of pins required. Just adding pins, however, will not necessarily result in a usable circuit. This is because, as the present inventors have found, that there is needed a semiconductor package that provides for dissipation of the thermal energy generated by the power amplifier during operation.

Accordingly, a power amplifier integrated with a CMOS chip that overcomes various ones, and preferably all, of the above disadvantages would be desirable.

SUMMARY OF THE INVENTION

It is an object of the present invention to provide a power amplifier integrated with other CMOS transceiver chip components that provides substantially linear operation.

It is another object of the present invention to provide a power amplifier integrated with other CMOS transceiver chip components that provides for operation at frequencies in the gigahertz range.

It is further object of the present invention to provide a power amplifier integrated with other CMOS transceiver components that provides for level shifting in order to increase the efficiency of the power amplifier transistors.

It is a further object of the present invention to provide an inductive bias with level shifting in a power amplifier integrated with other CMOS transceiver components in order to reduce the effects of gate capacitance and noise.

It is still a further object of the present invention to provide a breakdown resistance cascode structure for the power amplifier integrated with other CMOS transceiver components.

It is yet another object of the present invention to provide a semiconductor package for a power amplifier integrated with other CMOS transceiver components that provides for dissipation of the thermal energy generated by the power amplifier during operation.

The above objects of the present invention, among others, are achieved by the present invention, which provides a breakdown resistant transistor structure for amplifying communication signals, such as electromagnetic signals, and typically radio frequency signals. This structure includes a first NMOS transistor having a source connected to ground and a first gate for receiving the input radio frequency signal. The first gate is disposed above a first insulator and the first NMOS transistor having a first transconductance and a first breakdown voltage associated therewith. Also included is a second NMOS transistor having a source connected to the drain of the first NMOS transistor, a gate connected to the reference DC voltage, and a drain that provides the output for the amplified radio signal, the load being disposed between the reference DC voltage and the drain of the second NMOS transistor. The second gate is disposed above a second insulator, the second NMOS transistor has a second transconductance and a second breakdown voltage associated therewith, and the second insulator may be thicker than the first insulator. This results in the first transconductance being greater than the second transconductance, and the second breakdown voltage being greater than the first breakdown voltage.

The present invention also provides an integrated circuit chip apparatus for amplifying a differential communication signal that includes a differential input amplification stage, a first level shift, a differential driving stage, a second level shift stage, and a differential output stage.

Furthermore, the present invention includes an integrated circuit chip that is packaged in a semiconductor package containing terminals around only the periphery of one side of the package, and contains a metal ground plane on the one side of the package. Within the periphery area, and above it on the semiconductor chip, is disposed the differential input amplification stage, and the differential driver amplification stage. The differential output stage is disposed above the metal ground plane to act as a heat sink for thermal energy generated by the differential input amplification stage, the differential driver amplification stage, and the differential output stage.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENT

Figure 1:
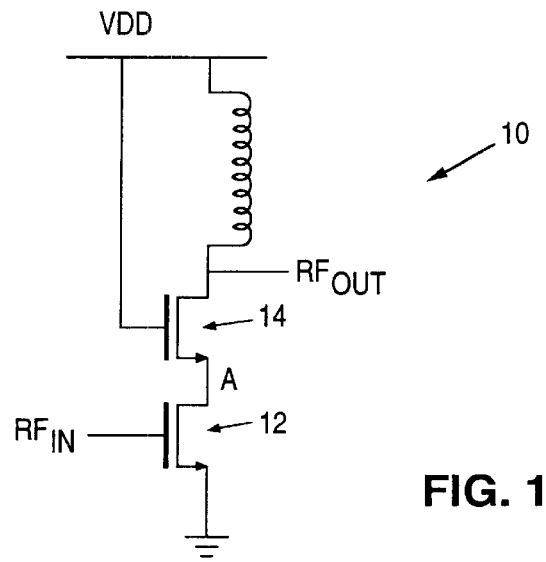
FIG. 1 illustrates a breakdown resistance transistor structure according to the present invention.

FIG. 1 illustrates a breakdown resistant transistor structure 10, which is one aspect of the present invention and is used in the final output stage of a power amplifier that is intended to be integrated with other CMOS circuit components, as described further hereinafter. The basic topology of this output stage is two NMOS transistors 12 and 14. As illustrated, a communication signal, such as a electromagnetic signal and typically a radio frequency signal, described herein as radio frequency input signal Rfin, is input at the gate of transistor 10, and the gate of transistor 14 is connected to the power supply voltage Vdd. Transistor 12 provides the transconductance necessary for power-amplification, and transistor 14 protects transistor 12 from the high voltage swings that result on the RFout node. Since transistor 14 is connected such that it has a unity current gain, it does not significantly degrade the transconductance of transistor 12 and can tolerate voltage amplitudes at RFout to be 2*Vdd without exceeding its breakdown voltage. Further, the voltage appearing at the source-drain connection between transistors 12 and 14 is a divided version of the RFout voltage, and as such excessive voltage swings do not appear at the junction of transistor 12.

Also, since the performance of the amplifier is set primarily by the transconductance of transistor 12, transistor 14 can be chosen to optimize breakdown-voltage by using a thicker gate-oxide. In particular, certain integrated circuit technologies allow different transistors to have different gate-oxide thicknesses. In certain processes, two different thicknesses are available. If such a process is used, if transistor 14 is made to have a thicker gate oxide thickness than transistor 12, then transistor 12 is optimized for higher transconductance but would cause a lower breakdown voltage if used alone. Since, however, transistor 14, which has a thicker gate-oxide, is optimized to produce a higher breakdown voltage, this protects transistor 12 from the high voltage swings that result on the RFout node. Further, it potentially allows the power amplifier to be used with a higher supply voltage, which eases the power amplifier design and potentially improves efficiency. The reduced transconductance of transistor 14 does not degrade the performance of the overall circuit, and is advantageous over a structure that uses a single transistor that has a higher breakdown and lower transconductance characteristic.

The above referenced transistor structure 10 is used in a CMOS integrated circuit transceiver, as described hereinafter.

Figure 2:
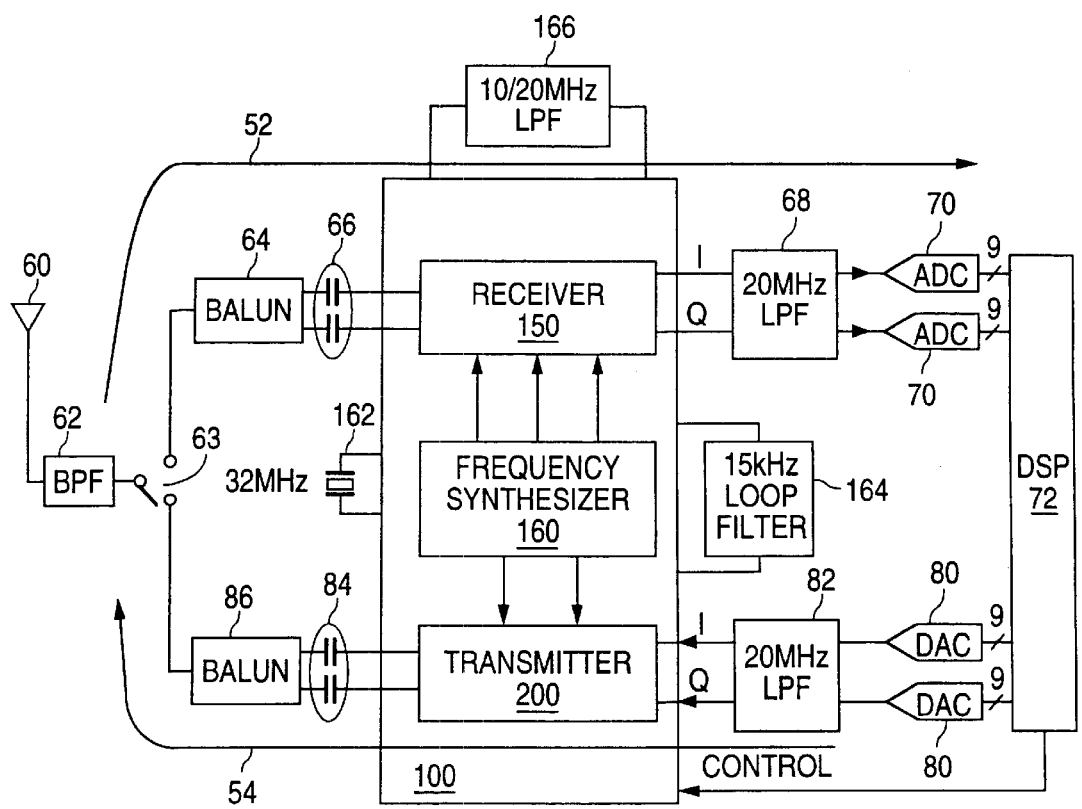
FIG. 2 illustrates a block diagram of an integrated transceiver chip according to the present invention.

FIG. 2 illustrates a block diagram of a transceiver integrated circuit 100 according to the present invention, and the components that serve as inputs and outputs to it. As shown in FIG. 2, there is a receive signal path 52 and a transmit signal path 54. Although the transmitter block 200 within the transceiver IC 100 will be described in most detail since it is the transmitter block 200 that contains the integrated power amplifier, these other components will be described at a high level in order to put the invention in the appropriate context.

Along the receive signal path 52, radio frequency signals, and preferably those that have a 20 or 40 MHz band centered at 5 GHz are input at the antenna 60. In the receive mode, a switch 63 is configured so that the receive signal path 52 is being used. Bandpass filter 62, balun 64, and capacitors 66 shape and match the received RF input signals so that the receiver 150 within the transceiver IC 100 can downconvert them to produce baseband quadrature (I and Q) input signals. These I and Q input signals are low pass filtered by a low pass filter 68, and are each digitized by an analog to digital converters 70, and then input into a digital signal processor (DSP) 72 for further processing.

Along the transmit signal path 54, output digital signals from the DSP 72 are converted to baseband quadrature I and Q output signals by digital to analog converters 80, that are each then low pass filtered by a low pass filter 82 and then received by the transmitter 200 within the transceiver IC 100. The transmitter 200 upconverts and amplifies the received baseband I and Q output signals to obtain the RF output signals. The RF output signals are then shaped and matched to the characteristics of the antenna 60 using capacitors 84, balun 86 and band pass filter 62 when the switch 63 is configured so that the transmit signal path 54 is being used.

Also shown in FIG. 2 are other substantial components within and external to the integrated transceiver 100, including the frequency synthesizer 160, the external crystal 162, operating at 32 MHz in the preferred embodiment, an external loop filter 164 for the synthesizer and a low pass filter 166 for channel selection.

Figure 3:
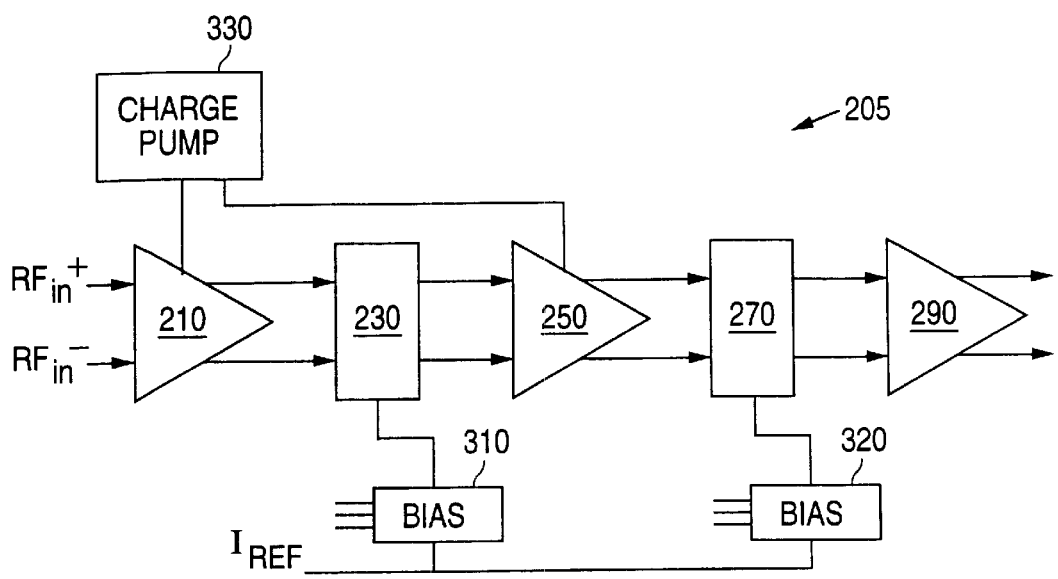
FIG. 3 illustrates a block diagram of a power amplifier portion of the transmitter of the integrated transceiver chip according to the present invention.

FIG. 3 provides a more detailed diagram of the power amplifier portion 205 of the transmitter 200. An input stage 210 receives as its input upconverted fully differential RF signals Rfin+ and Rfm− having true and complement components, as is known. The upconversion can be made using quadrature mixers with 4 GHz and 1 GHz local oscillator signals.

As shown, the received Rfin+ and Rfin− upconverted signals are amplified by the input stage 210, level shifted using a first level shift stage 230, and then amplified by driver stage 250. The output of the driver stage 250 is then again level shifted using a second level shift stage 270 before being input to the output stage 290. The output stage 290 is composed of the transistor structure previously described with reference to FIG. 1, as will be further noted hereinafter.

The input stage 210, the driver stage 250 and the output stage 290 are each formed of a common-source and a common-gate amplifier combined in a cascode configuration, as will become apparent hereinafter. As also shown in FIG. 3, the driver and output stages 250 and 290 are biased by bias blocks 310 and 320, in order to provide gate bias voltages thereto.

Further, a charge pump 330 is used to provide a reference voltage (such as 3.3 volts) that is above the Vdd reference voltage (such as 2.5 volts) to the input stage 210 and the driver stage 250, as will become apparent hereinafter. It should be noted that in any amplifier stage, such as the input stage 210 described further hereinafter, care should be taken to avoid the lower voltage supply from having an actual voltage that is higher than nominal at the same time that the higher voltage supply has an actual voltage that is lower than nominal. The charge pump thus preferably will have the higher voltage level vary in tandem with the lower voltage level.

Figure 4:
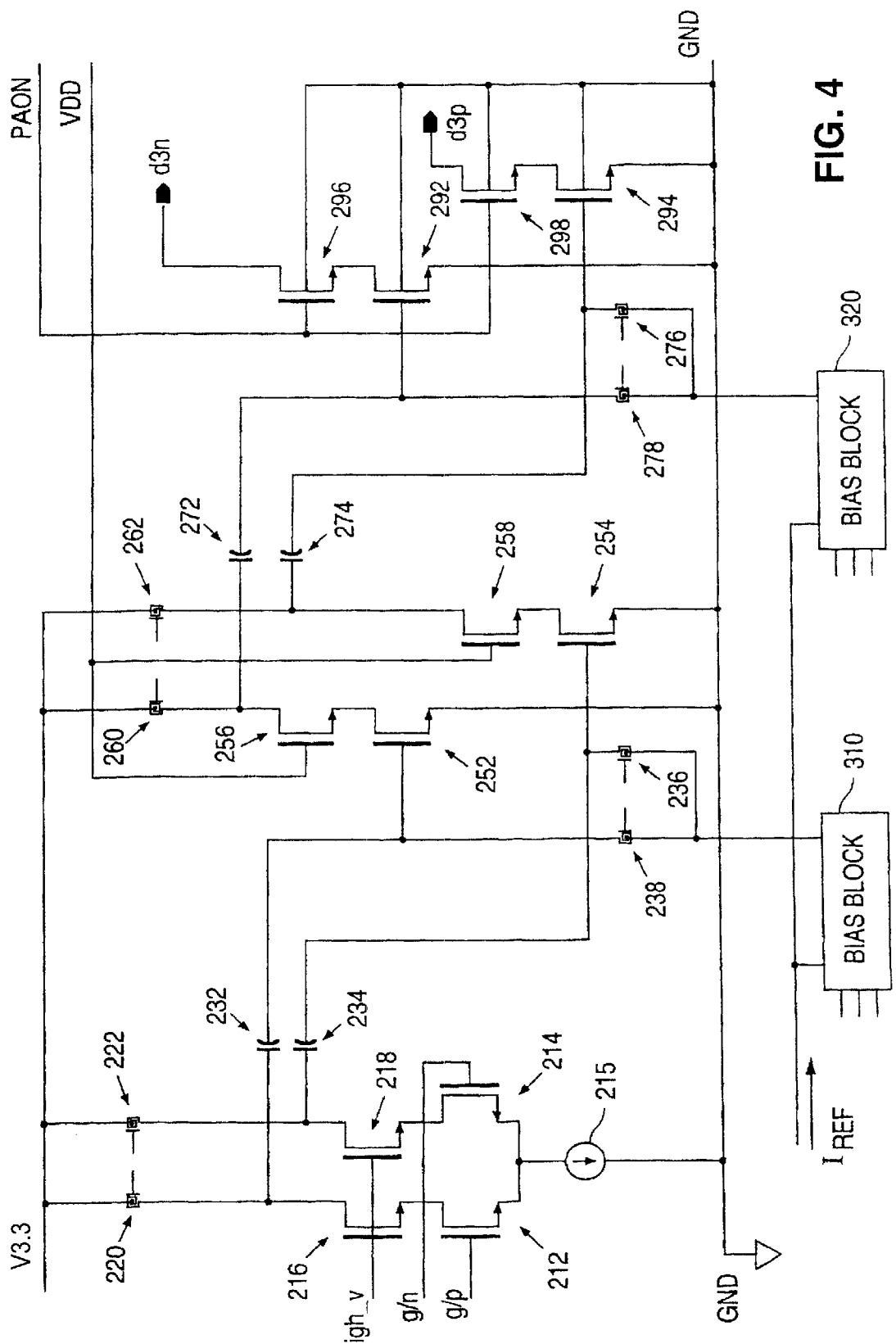
FIG. 4 illustrates a circuit diagram of the power amplifier portion of the transmitter of the integrated transceiver chip according to the present invention.

FIG. 4 illustrates the circuit of FIG. 3 in more detail. As shown, the input stage 210 is comprised of NMOS transistors 212 and 214 having a common source, which is connected to current source 215. Each also inputs at its respective gate one of the previously upconverted Rfin+ and Rfin− signals. NMOS transistors 216 and 218 each have their source connected to the drain of transistors 212 and 214, respectively, and are tied to an input gate voltage that is the charge pump voltage higher than Vdd, such as 3.3 volts. The drain of transistors 216 and 218 form the output to the first level shift stage 230. Disposed between the supply voltage that is higher than Vdd, such as 3.3 volts, and the drain of each of transistors 216 and 218 are inductors 220 and 222, respectively, which will typically be in the range of 0.5 n to 5 n henries.

The first level shift stage 230 includes blocking capacitors 232 and 234, and shunt inductors 236 and 238. Since the size of capacitors 232 and 234 are limited by the real estate available on the integrated circuit 100, the size of capacitors 232 and 234 are each typically between 0.1 p and 10 p farads and the inductors 236 and 238 will typically be in the range of 0.2 n and 5 n henries. As a result, the presence of the blocking capacitors allows setting the gate bias of the driver stage 250 to a voltage lower than VDD, which improves the ability of the driver transistors to tolerate a large voltage swing at the drain while remaining in saturation. However, a blocking capacitor of the size of capacitors 232 and 234 alone would create a voltage divider between the blocking capacitor (such as 232) and the capacitor created at the gate of the driver stage (such as transistor 252 discussed hereinafter), resulting in an undesired signal attenuation.

Thus, shunt inductors (such as 236) are used in parallel with the gates of the driver stage transistors (such as 252) to substantially resonate out the gate capacitance, and thus improve the signal transfer across the blocking capacitors. The gate bias voltage to the driver stage is applied from a bias block 240 through the shunt inductors 236 and 238.

In the driver stage 250, NMOS transistors 252 and 254 having a common source, which is connected to ground. Each also inputs at its respective gate the previously upconverted fully differential output signals that have been amplified in the first input stage 210 and level shifted by the first level shift stage 230. NMOS transistors 256 and 258 each have their source connected to the drain of transistors 252 and 254, respectively, and are tied to an input gate voltage of Vdd. The drain of transistors 256 and 258 form the input to the second level shift stage 270. Disposed between a voltage source that is higher than Vdd and the drain of each of transistors 256 and 258 are inductors 260 and 262, respectively, which will typically be in the range of 0.5 n to 5 n henries.

The second level shift stage 270 includes blocking capacitors 272 and 274, and shunt inductors 276 and 278. The size of capacitors 272 and 274 are each typically between 1–3 picofarads and the inductors 236 and 238 will typically be in the range of 0.5–2nanohenries. The second level shift stage provides the same functionality as the first level shift stage above, so that the gate bias of the output stage 290 can be set to a voltage lower than VDD, and also minimize undesired signal, thereby improving the signal transfer across the blocking capacitors, as discussed above. The gate bias voltage to the output stage is applied from a bias block 320 through the shunt inductors 276 and 278.

The output stage 290 uses the breakdown resistant transistor structure 10 described above on each of the I and Q signal paths. Thus, each of NMOS transistors 292 and 294 are optimized as the high transductance transistors, whereas transistors 296 and 298 are optimized to produce a higher breakdown voltage, as previously discussed. As shown, the gate of transistors 296 and 298 are each connected to a power amplifier on (paon) control signal controlled by the DSP 71.

The three stage fully-differential, linear class-A power amplifier 205 described above is capable of producing output power of 24 dBm (250 mW) under typical conditions (50 C). The maximum linear power of the amplifier (defined by P1 dB) is approximately 22.5 dBm (178 mW). Thus the power amplifier 205 can transmit an average power of at least 17.5 dBm (56.5 mW) with 5 dB of backoff from the 1 dB gain compression power, for the specific design and intended use provided above.

With respect to operation of the power amplifier 205 and the frequencies of interest, which are typically RF frequencies, the geometries of the transistors must be properly chosen. Since the speed of the transistors that make up the amplifier stages 210, 250 and 270 are inversely proportional to the length of the channel, all of the transistors in the signal path are preferably designed with the minimum channel length that the design rules will allow, such as 240 nm. Additionally, since large device widths can result in undesired gate resistance, each transistor is sized such that its width does not exceed some measure. 5 um has been determined a useful maximum for design rules in which the minimum channel length is 240 nm. Accordingly, to achieve the large transistor sizes that are necessary for desired output power, a cell with a width of approximately 5 $\mu$m and a length of 240 nm is replicated to form a transistor with the necessary size. In a preferred embodiment, for example transistors 212 and 214 in the input stage 210 together contain 48 devices used in parallel (24 on each differential side), the transistors 252 and 254 in the driver stage 250 together contain 72 devices used in parallel (36 on each differential side) and the transistors 292 and 294 in the output stage 290 together contain 220 devices used in parallel (110 on each differential side) to achieve the desired output power. A similar number of devices are preferably used for the other pairs of transistors (transistor pairs 216–218; 256–258; 296–298) in each output stage.

In operation, since all the amplifier stages 210, 250 and 270 are differential, the AC current through the ground bonds is ideally zero. This effectively nullifies the inductance of the ground bondwires, enabling each amplifier stage to have reasonable power gain without the low-inductance custom packaging or backside ground-contacts that are typically found in higher-performance GaAs RF power amplifiers. This approach typically requires the external balun 86 to drive the antenna 60 with a single-ended signal, and can result in appreciable insertion loss through the balun 86 of about 0.5–1 dB, thus resulting in the need for a higher power target from the power amplifier 205. Nevertheless, it has been determined that the advantages of an integrated power amplifier greatly outweigh the potential disadvantage of complying with the above-mentioned potential requirements.

In the above discussion, the reference to Class-A operation means that the quiescent current in each of the amplifier stages 210, 250 and 270 is set high enough such that the output stage transistors are always conducting current throughout the AC swing. The maximum theoretical drain efficiency of a power amplifier operating in this mode is 50% (2 mW of DC power is required for every 1 mW delivered to the load). Class-A amplifiers also dissipate a constant DC power regardless of output signal amplitude, resulting in much lower efficiency when the signal envelope is below maximum levels. Despite obvious disadvantages in power dissipation, the Class-A methodology is used to maximize gain and linearity performance. Higher efficiency modes of operation, while dissipating less DC current, have of the system being set by stages more difficult to tune and debug within an integrated amplifier chain.

Further, the output power delivered by the power amplifier 205 is preferably a linear function of the input voltage amplitude in the range of operation. Information is contained in the amplitude of the transmitted signal, and distortion of the amplitude levels through the power amplifier will cause degradation in link quality. The degree to which the signal envelope varies can be characterized by the "peak-to-average ratio", which is the ratio of the maximum signal amplitude to the average signal amplitude, and is usually expressed in dB. The implication of linear operation of the power amplifier is that the peak-to-average ratio must be subtracted from the maximum linear power capability of the power amplifier to determine the average power that is achievable. In a preferred embodiment, the maximum linear power of the power amplifier is 22.5 dBm, and the expected peak-to-average ratio is 5 dB, so the average power available for transmission is 17.5 dBm. Furthermore, due to class-A operation, the power amplifier always draws enough DC current to be able to transmit at peak power, so as the peak-to-average signal is increased, the operating efficiency of the power amplifier decreases. With a peak-to-average ratio of 5 dB, the maximum drain efficiency of the ideal class-A amplifier is reduced from 50% to 16%.

Another aspect of the present invention is the inclusion of a 3-bit register in each of the bias blocks 310 and 320 in order to vary the quiescent current of the driver stage 250 and the output stage 290. The bias blocks 310 and 320 each contain bias configurations that allow one of eight different biases to be used in order to vary the gate bias voltage, and thus the quiescent current, of the driver stage 250 and the output stage 290, respectively. Each of these bias blocks 310 and 320 are implemented using a current mirror in which separate branches can be switched and summed together, depending upon the state of the 3 bit registers.

While the above integrated power amplifier design provides advantages not found in current integrated power amplifier designs, other considerations can be taken into account to improve performance even further. One consideration is the thermal characteristics of the integrated circuit transceiver. When the power amplifier is integrated with other transceiver components, the thermal effects of the power amplifier do affect the other circuit components much more severely than if the power amplifier were not integrated. Further, since according to the present invention a power amplifier with linear characteristics is desired, dissipating the thermal energy built up by the power amplifier can assist in allowing such linear characteristics over a variety of conditions.

In an integrated transceiver 100, which contains pins or terminals for establishing connections to external circuit components for the various signals received and sent to the receiver 150 and the transmitter 200, including the power amplifier portion 205, the required number of such pins or terminals is large, in excess of 50 in the preferred embodiment. Accordingly, if conventional design philosophy were used, one would use an integrated circuit packaging technique that allows for the pins to be disposed along the entire underside of the integrated circuit package. While such a design could provide the pin count required, it has been found difficult to satisfy the thermal concerns that result from the build up of thermal energy in the power amplifier.

Figure 5C:
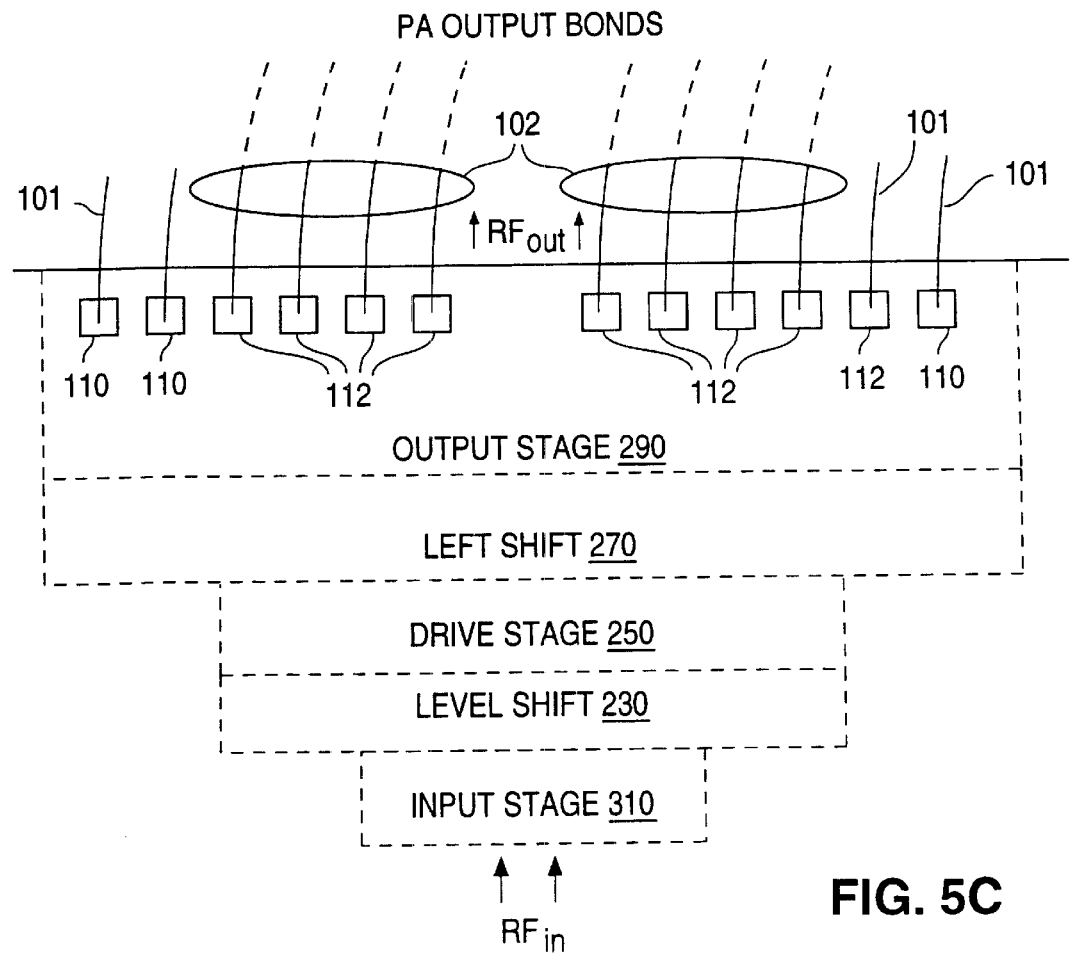
FIGS. 5A–5C illustrate diagrams of the integrated transceiver chip and packaging and circuit component locations according to the present invention.
Figure 5A:
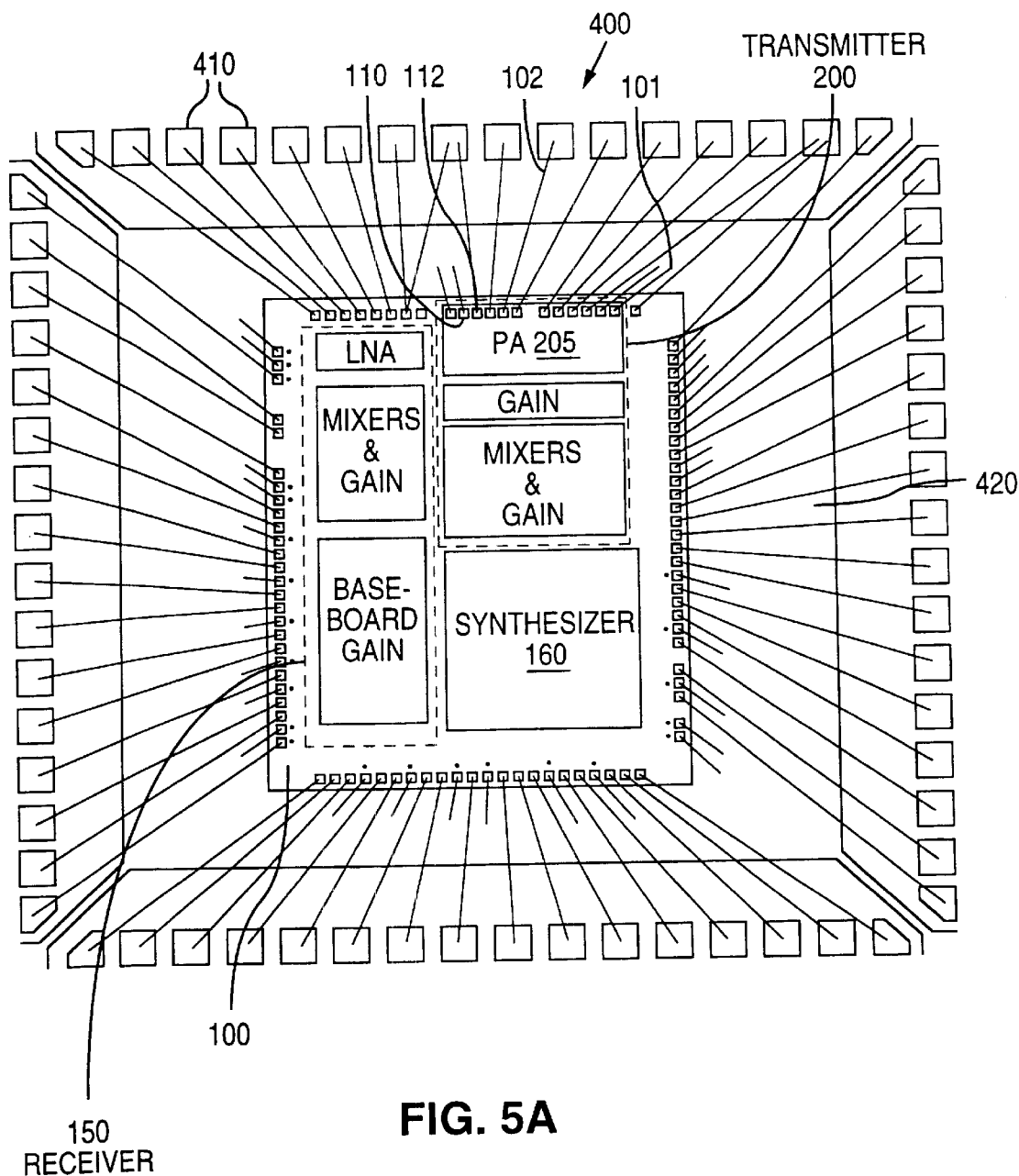
Figure 5B:
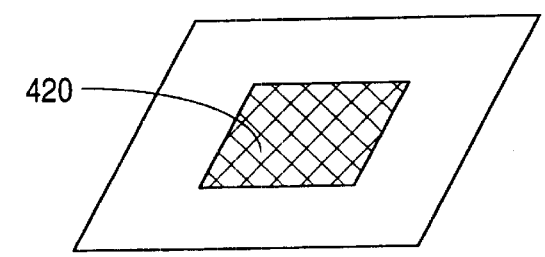

Accordingly, as shown in FIG. 5A, the present invention uses a leadless plastic chip carrier semiconductor package 400 that contains terminals 410 along the periphery of the package 400. Further, as shown in FIG. 5B, the package 400 has a metal ground plane 420 along the underside of the package 400. As shown in FIG. 5A, component connections 101 to electrical ground within the integrated circuit chip 100 are electrically grounded to this ground plane.

FIG. 5A illustrates the location of the various components of the integrated transceiver chip, including components that made up the receiver 150 and the transmitter 200. With respect to the power amplifier 205 that is part of the transmitter 200, it is positioned at the edge of the integrated circuit so that the output of the output stage 290 of the power amplifier 205 is within about 500 um from the edge, thus allowing for short bond wires 101 to connect the power amplifier ground to the ground plane, as well as have the wires 102 that connect to the terminals 410 be as short as possible. With the layout of the power amplifier 205 taking into account the location of the ground plane, thermal energy from the power amplifier can be dissipated in the ground plane.

FIG. 5C shows a top-view of the location of the various components of the power amplifier 205. Input stage 210, the level shift stage 230, the drive stage 250, the level shift stage 270, and the output stage 290 are configured so that the output stage 290, and specifically the outputs of the output stage 290, are nearest to the RF bond pads 112 and the standard bond pads 110.

Figure 6A:
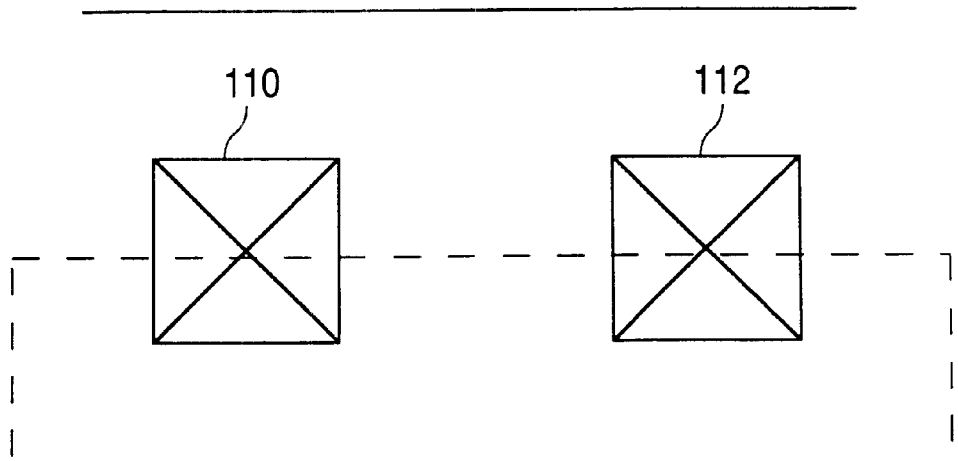
FIGS. 6A–6B illustrate a top view and cross section of bond pads according to the present invention.
Figure 6B:
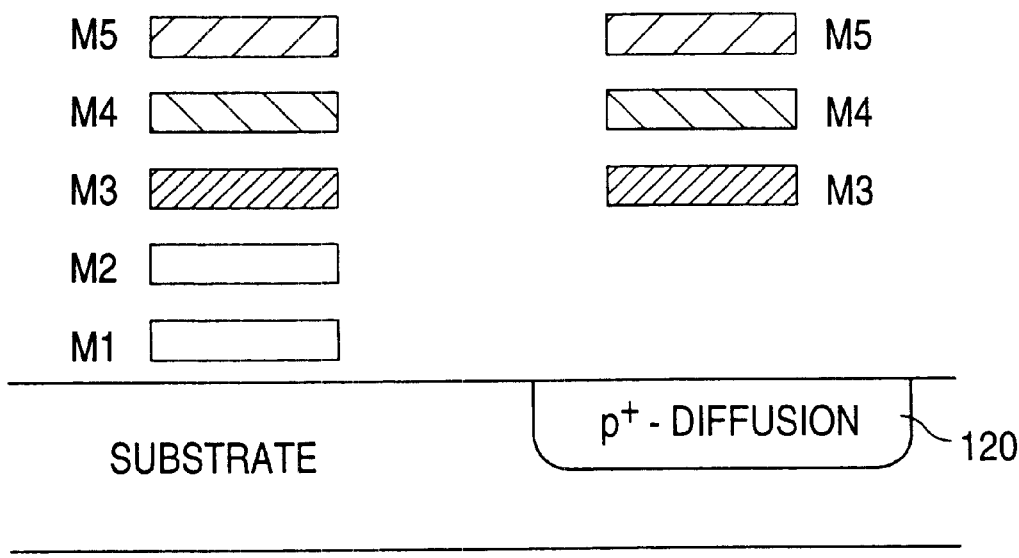

Also, the outputs of the transistors in the output stage 290 of the power amplifier 205 are integrated into the bond pads of the integrated circuit so as to reduce the parasitic resistance in series with the output transistors. As shown in FIGS. 6A and 6B, in order to reduce parasitic capacitance associated with a standard bond pad 110, metal1 and metal2 layers are not used in the RF bond pads 112, while the metal1 and metal2 layers are used in standard bond pads 110. That is, only metal3, 4, and 5 are present underneath the passivation opening of bond pads 112. To further reduce the resistive loss associated with the parasitic capacitance, a silicided p+ diffusion shield 120 is used beneath the metal3 of the bond pads 112.

Figure 7:
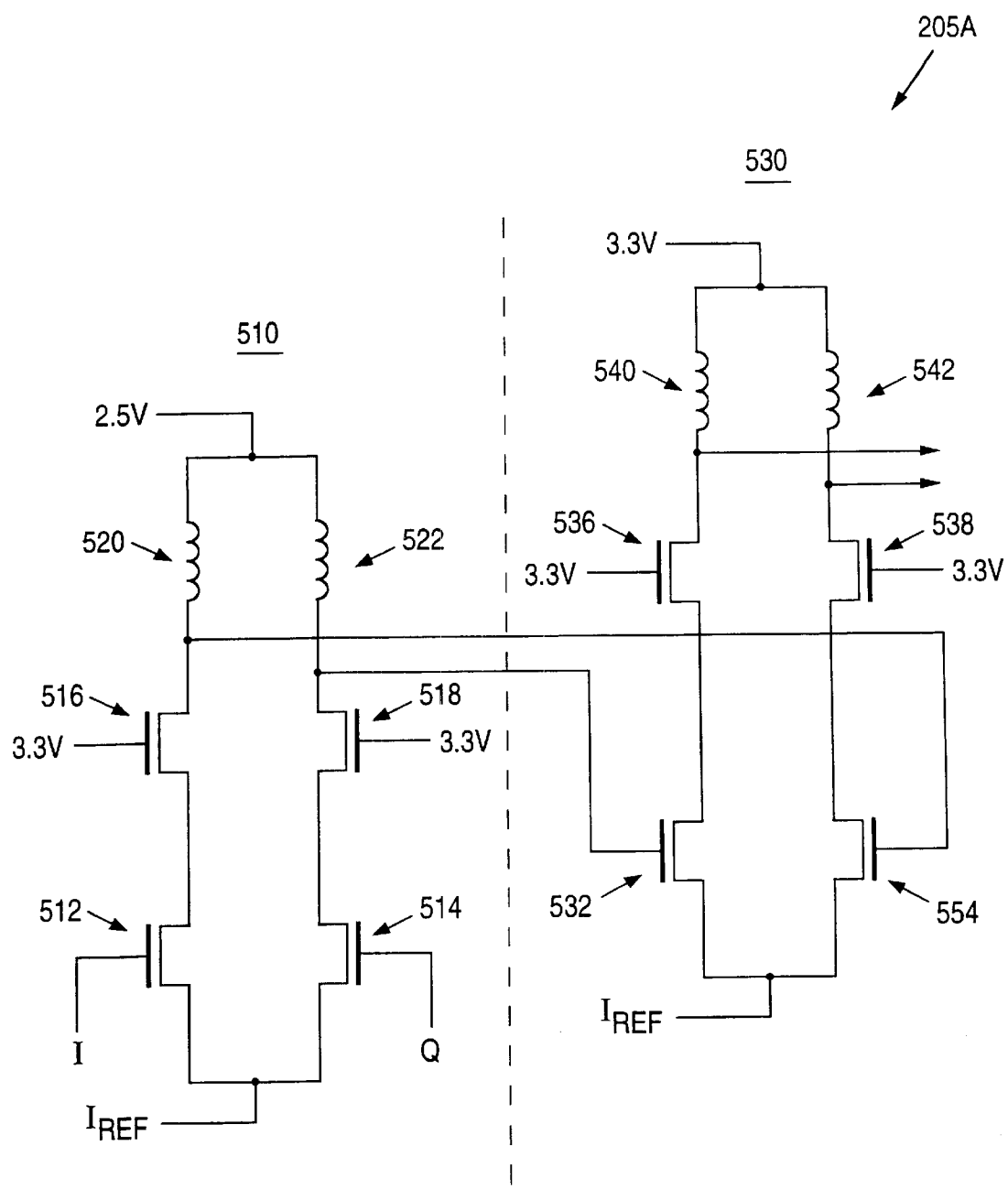
FIG. 7 illustrates another embodiment of the power amplifier portion of the transmitter of the integrated transceiver chip according to the present invention.

In another embodiment, an integrated power amplifier 205A, shown in FIG. 7, the cascode structure of the various amplifier stages is retained, particularly the usage of transistor 10 having a high transductance along with a transistor 12 having a high breakdown voltage as described in FIG. 1. In this embodiment, however, the level shift stages described above with respect to FIGS. 3 and 4 are omitted, and the output of one gain stage is directly coupled to the input of the next gain stage. As shown in FIG. 7, a first gain stage 510 is directly connected to a second gain stage 530.

The first gain stage 510, unlike the gain stage 210 of FIG. 3, is connected to the Vdd voltage (such as 2.5 volts) rather than any voltage that exceeds Vdd (such as 3.3 volts). Thus, this first gain stage 510 is comprised of NMOS transistors 512 and 514 having a common source, which is connected to a current source 580. Each also inputs at its respective gate one of the previously upconverted fully differential signals. NMOS transistors 516 and 518 each have their source connected to the drain of transistors 512 and 514, respectively, and are tied to an input gate voltage that is the charge pump voltage higher than Vdd, such as 3.3 volts. The drain of transistors 516 and 518 form the output to the first level shift stage 230. Disposed between the Vdd voltage source and the drain of each of transistors 516 and 518 are inductors 520 and 522, respectively, which will typically be in the range of 0.5 n to 5 n henries.

The second gain stage 530 is directly connected to the first gain stage 510. The second gain stage 530 includes NMOS transistors 532 and 534 having a common source, which is connected to a current source 590. Each also inputs at its respective gate one of the previously upconverted fully differential signals that have been amplified in the first gain stage 510. NMOS transistors 536 and 538 each have their source connected to the drain of transistors 532 and 534, respectively, and are tied to an input gate voltage that is the charge pump voltage higher than Vdd, such as 3.3 volts. The drain of transistors 536 and 538 form the output from the second gain stage 230. Disposed between the charge pump voltage source that is higher than Vdd, such as 3.3 volts, and the drain of each of transistors 536 and 538 are inductors 540 and 542, respectively, which will typically be in the range of 0.5 n to 5 n henries.

Thus, in this embodiment of FIG. 7, savings in terms of area can be achieved since the on-chip level shift capacitors that require a large amount of area are not needed. This is obtained, however, at the expense of an output voltage that can swing only a lesser amount than the topology of 205. In this design, the output swing cannot be lower than 2.5V without compromising the signal linearity. This is because the supply voltage at the input gain stage 510 is lower and the gate voltage of the transistors such as transistors 512 and 514 is limited to be near the supply voltage of 510, since in this embodiment the DC component of the input signal is between about 2.0 and 2.5 volts. In the embodiment of 205, the use of a level-shifter allows the input signal to be at a lower voltage of between about 0.8 to 1.5V.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the spirit and scope of the invention as set forth in the appended claims.

We claim:

1. An integrated circuit transistor structure for amplifying a radio frequency signal in a circuit having a reference DC voltage to obtain an amplified radio frequency signal to an output that has a load associated therewith comprising:

a first NMOS transistor having a first source connected to ground and a first gate for receiving the radio frequency signal, wherein the first gate is disposed above a first insulator and the first NMOS transistor having a first transconductance and a first breakdown voltage associated therewith; and a second NMOS transistor having a second source connected to a first drain of the first NMOS transistor, a second gate connected to the reference DC voltage, and a second drain that provides the output for the amplified radio signal, the load being disposed between the reference DC voltage and the second drain of the second NMOS transistor, wherein the second gate is disposed above a second insulator, the second NMOS transistor having a second transconductance and a second breakdown voltage associated therewith.

2. A transistor structure according to claim 1 wherein the second insulator is thicker than the first insulator so that the first transconductance is greater than the second transconductance.

3. A transistor structure according to claim 2 wherein the second breakdown voltage is greater than the first breakdown voltage.

4. A transistor structure according to claim 1 wherein the second breakdown voltage is greater than the first breakdown voltage.

5. A transistor structure according to claim 1 wherein the second insulator is substantially the same thickness as the first insulator.

6. A transistor structure according to claim 1 wherein the integrated circuit transistor structure is disposed within a semiconductor chip package that contains a metal ground plane, and wherein each of the first and second NMOS transistors have a portion that is electrically connected to the ground plane.

7. A transistor structure according to claim 6 wherein the electrical connection to the ground plane includes an electrical connection through a bond pad.

8. A transistor structure according to claim 6 wherein the output for the amplified radio signal within 500 $\mu$m of an edge of the integrated circuit.

9. A transistor structure according to claim 8 wherein the output for the amplified radio signal is connected to a terminal on a semiconductor chip package through a radio signal bond pad, the radio signal bond pad including less than all of a plurality of metal layers capable of being associated therewith.

10. A transistor structure according to claim 9 wherein the radio signal bond pad includes a diffusion layer in the substrate disposed therebelow.

11. A transistor structure according to claim 9 wherein the output for the amplified radio signal is not connected through the bottom two electrical layers on the radio signal bond pad that is capable of having five layers.

12. A transistor structure according to claim 1 further including an inductor disposed between the reference DC voltage and the output with the load associated therewith, wherein the reference DC voltage is Vdd and wherein the output with the load associated therewith can tolerate voltage amplitudes of approximately 2 Vdd without exceeding the second breakdown voltage of the second NMOS transistor.

13. A transistor structure according to claim 12 wherein the inductor is a bondwire inductor.

14. A transistor structure according to claim 12 further including other CMOS transceiver chip components on the integrated circuit.

15. A transistor structure according to claim 12 wherein the first and second NMOS transistors provide a last stage of a multi-stage amplifier, the multi-stage amplifier being disposed on the integrated circuit.

16. A transistor structure according to claim 8 further including other CMOS transceiver chip components on the integrated circuit.

17. A transistor structure according to claim 16 wherein the first and second NMOS transistors provide a last stage of a multi-stage amplifier, the multi-stage amplifier being disposed on the integrated circuit.

18. A transistor structure according to claim 1 further including other CMOS transceiver chip components on the integrated circuit.

19. A transistor structure according to claim 1, further including a differential transistor structure formed of two circuits, each of the two circuits comprising the transistor structure recited in claim 1.

20. A transistor structure according to claim 1 wherein the first and second NMOS transistors provide a last stage of a multi-stage amplifier, the multi-stage amplifier being disposed on the integrated circuit.

* * * * *